United States Patent
Okuno et al.

[11] Patent Number: 6,063,646
[45] Date of Patent: May 16, 2000

[54] METHOD FOR PRODUCTION OF SEMICONDUCTOR PACKAGE

[75] Inventors: Atsushi Okuno; Koichiro Nagai; Noriko Fujita, all of Osaka-fu; Yuki Ishikawa, Kyoto-fu; Noritaka Oyama, Osaka-fu; Tsunekazu Hashimoto, Shiga-ken, all of Japan

[73] Assignee: Japan Rec Co., Ltd., Osaka-fu, Japan

[21] Appl. No.: 09/167,207

[22] Filed: Oct. 6, 1998

[51] Int. Cl.[7] .......................... H01L 21/44; H01L 21/48; H01L 21/50
[52] U.S. Cl. .......................... 438/107; 438/106; 438/460; 438/612; 438/613
[58] Field of Search ..................................... 438/107, 106, 438/15, 460, 612, 613

[56] References Cited

U.S. PATENT DOCUMENTS

| | | |
|---|---|---|
| 4,600,600 | 7/1986 | Pammon et al. . |
| 5,620,927 | 4/1997 | Lee . |
| 5,849,608 | 12/1998 | Abe .......................................... 438/123 |
| 5,851,845 | 12/1998 | Wood et al. .............................. 438/107 |

FOREIGN PATENT DOCUMENTS 10079362  3/1998  Japan .

*Primary Examiner*—Kevin M. Picardat
*Assistant Examiner*—D. M. Collins
*Attorney, Agent, or Firm*—Knobbe, Martens, Olson & Bear, LLP

[57] ABSTRACT

The invention provides a method for producing semiconductor packages comprising the steps of forming electronic circuits for a plurality of semiconductor chips 11 on a wafer 1, forming bumps 2 on the plurality of semiconductor chips 11, encapsulating the circuit-forming surface 111 of the wafer 1 and the bumps 2 with a sealant by screen printing means to form a sealant layer 4, curing the sealant layer 4, grinding the surface of the sealant layer 4 until the upper end surface of the bump 2 becomes exposed, placing solder balls on said upper end surface of bumps 2 to weld the balls to the surface thereof, and dicing the wafer 1 and the sealant layer 4 as united into individual semiconductor chips 11. Screen printing means is used to encapsulate the entire surface of the wafer with a resin, so that the equipment costs can be markedly reduced as compared with conventional methods using a mold.

4 Claims, 15 Drawing Sheets

METHOD FOR PRODUCTION OF SEMICONDUCTOR PACKAGE

FIELD OF THE INVENTION

The present invention relates to a method for producing a chip-size semiconductor package.

BACKGROUND ART

In view of recent development of electronic equipment such as portable telephones, notebook-size personal computers, electronic personal data books, etc., there are demands for production of semiconductor packages of higher density, smaller size and reduced thickness which are useful for such electronic equipment.

To meet said demands, various kinds of semiconductor packages have been developed. Examples are LSI-mounting TAB, tape carriers, plastic leaded chip carriers (PLCC), ball grid arrays (BGA), chip-size packages (CSP), flip chips, etc. These semiconductor packages have excellent features but are defective in production efficiency and mounting reliability.

Methods have been proposed for producing chip-size semiconductor packages among said semiconductor packages in an attempt to improve the production efficiency and the mounting reliability (of. Japanese Unexamined Patent Publication No.79362/1998). According to the proposed methods, electronic circuits for a plurality of semiconductor chips are formed on a wafer and bumps are provided on the semiconductor chips. Then, after the wafer is placed into a mold cavity, a resin is supplied to the space around the bumps to encapsulate the bumps by the so-called transfer molding. Thereafter at least the tips of bumps covered with the resin layer are exposed at the surface of the resin layer. Finally the wafer with the resin layer formed thereon is cut into individual semiconductor chips to obtain semiconductor packages.

According to the foregoing conventional methods for producing semiconductor packages, a resin layer is formed on the bump-arranged surface of the wafer before mounting the semiconductor packages on the printed circuit board. Consequently the methods eliminate the need for the step of filling an encapsulation resin into a narrow space between the semiconductor chips and the printed circuit board after mounting the semiconductor chips on the board so that the mounting reliability is improved. Because of the encapsulation of the wafer with a resin, the methods can achieve a higher production efficiency than the encapsulation of individual semiconductor packages with a resin.

However, the conventional methods pose the following problems due to the use of ai mold. First of all, high investment in equipment is essentially needed. Further, since the encapsulating step and heat-curing step are conducted in this order within the mold, the wafer is confined in the mold for a prolonged period of time, thereby lowering the production efficiency. Moreover it is difficult to form a resin layer having a thickness of 1 mm or less.

DISCLOSURE OF THE INVENTION

The present invention was accomplished to overcome the above-mentioned prior art problems. An object of the invention is to provide a method for producing semiconductor packages, the method being capable of lowering the equipment investment, increasing the production efficiency and forming a resin layer with a thickness of 1 mm or less.

Other features of the invention will become apparent from the following description.

According to the invention, there is provided a method for producing semiconductor packages, the method comprising the steps of:

forming electronic circuits for a plurality of semiconductor chips on a wafer;

forming bumps on the plurality of semiconductor chips, encapsulating the circuit-forming surface of the wafer and bumps with a sealant by screen printing means to form a sealant layer;

curing the sealant layer;

grinding the surface of the sealant layer until the upper end surface of the bumps becomes exposed;

placing solder balls on said upper end surface of the bumps to weld the balls to the surface thereof; and dicing the wafer and the sealant layer as united into individual semiconductor chips.

BRIEF DESCRIPTION OF THE INVENTION

DESCRIPTION OF THE PREFERRED EMBODIMENTS

This invention will be further clarified by the description of two embodiments with reference to the accompanying drawings. The invention, however, is not limited to the embodiments, but various modifications are possible without deviation from the scope of the invention.

Figure 1:
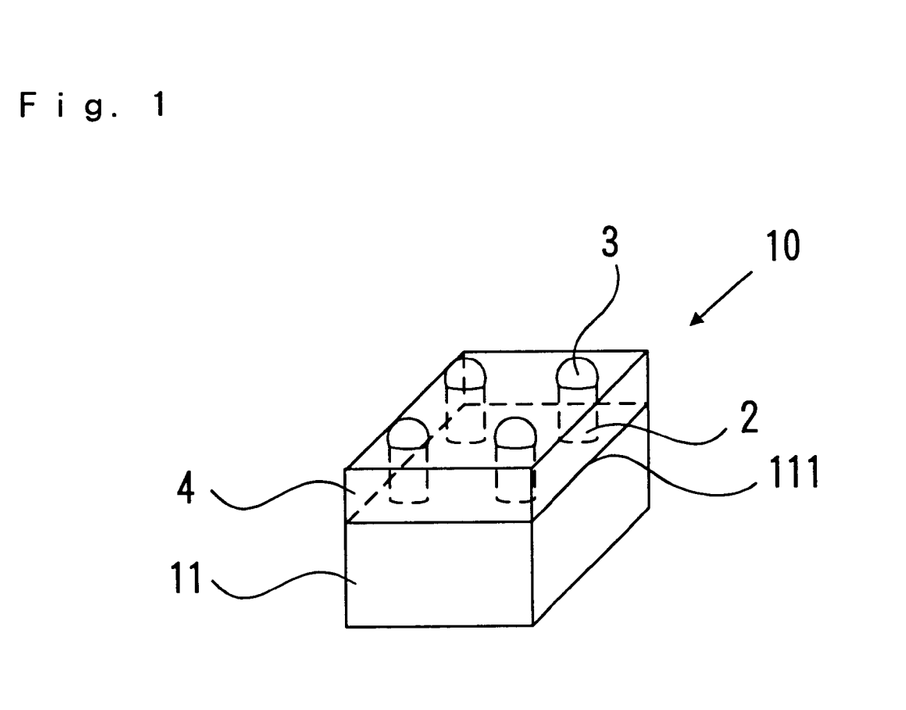
FIG. 1 is a perspective view showing an example of semiconductor packages produced by the method for producing semiconductor packages according to the invention.
Figure 2:
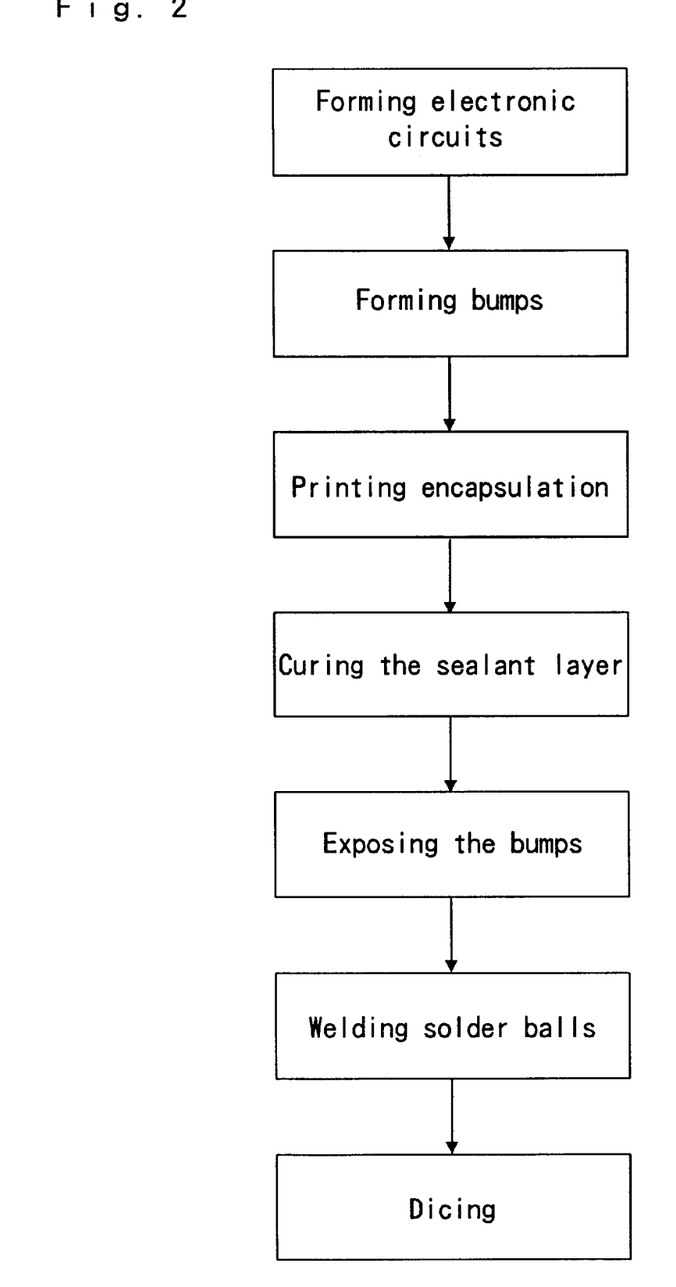
FIG. 2 is a flow chart showing an embodiment of the invention.

FIG. 2 is a flow chart showing a first embodiment of the invention. FIGS. 3–9 schematically show respective steps of the method depicted in FIG. 2. FIG. 1 is a perspective view showing an example of semiconductor packages produced by the producing method practiced stepwise as illustrated in FIG. 2.

First, the structure of a semiconductor package 10 is described below with reference to FIG. 1. The semiconductor package 10 comprises a semiconductor chip 11, bumps 2 serving as electrodes, a sealant layer 4 having substantially the same height as the bumps 2 and solder balls 3 welded to the upper end surface of bumps. Namely the semiconductor package 10 has a very simple structure.

The semiconductor package 10 with said structure is substantially equal in size to the semiconductor chip 11, and is of the so-called chip-size package structure. Because of this structure, the semiconductor package produced by the method of the invention can satisfactorily fulfil the need for the miniaturized semiconductor packages as required in recent years.

The method for producing the semiconductor package 10 is described below with reference to FIGS. 2–9. The semiconductor package 10 is produced by carrying out the steps shown in FIG. 2.

Figure 3:
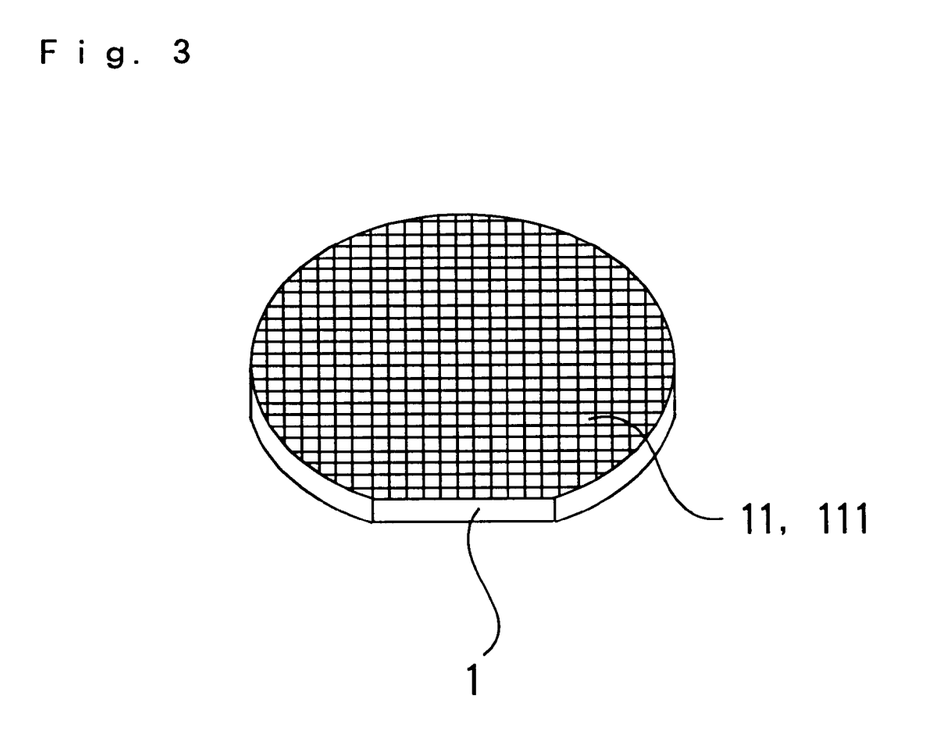
FIG. 3 is a perspective view schematically showing electronic circuits as formed on the wafer in an embodiment of the method for producing semiconductor packages according to the invention.

In the step of forming electronic circuits in FIG. 2, electronic circuits (not shown) corresponding to a plurality of semiconductor chips 11, e.g. a few hundreds of semiconductor chips, are formed on a wafer 1 made of silicone or the like as shown in FIG. 3. The electronic circuits are formed by conventional techniques as by application of excimer laser.

Figure 4:
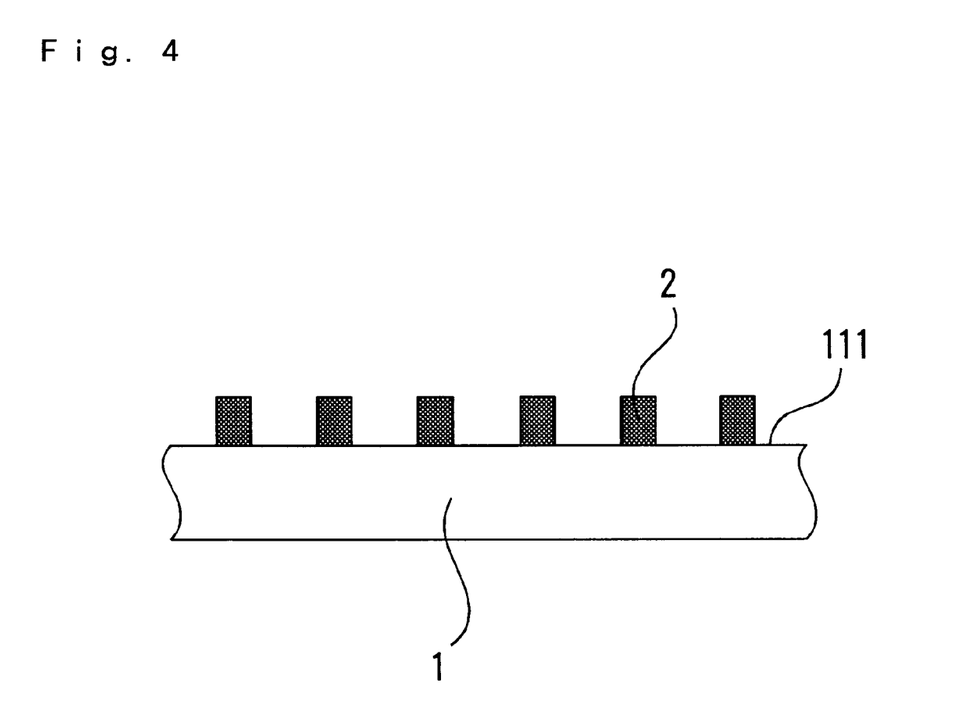
FIG. 4 is a longitudinal sectional view schematically showing the bumps as formed on the circuit-forming side of the wafer.

After practicing the step of forming the electronic circuits, the wafer 1 is subjected to the step of forming bumps. In the step of forming bumps, pillar-shaped bumps 2 with the specified height are provided on the wafer surface 111 provided with the circuit as shown in FIG. 4. The bumps 2 are formed by the bump-forming technique conventionally used for flip chips or the like, such as the plating method.

Figure 5:
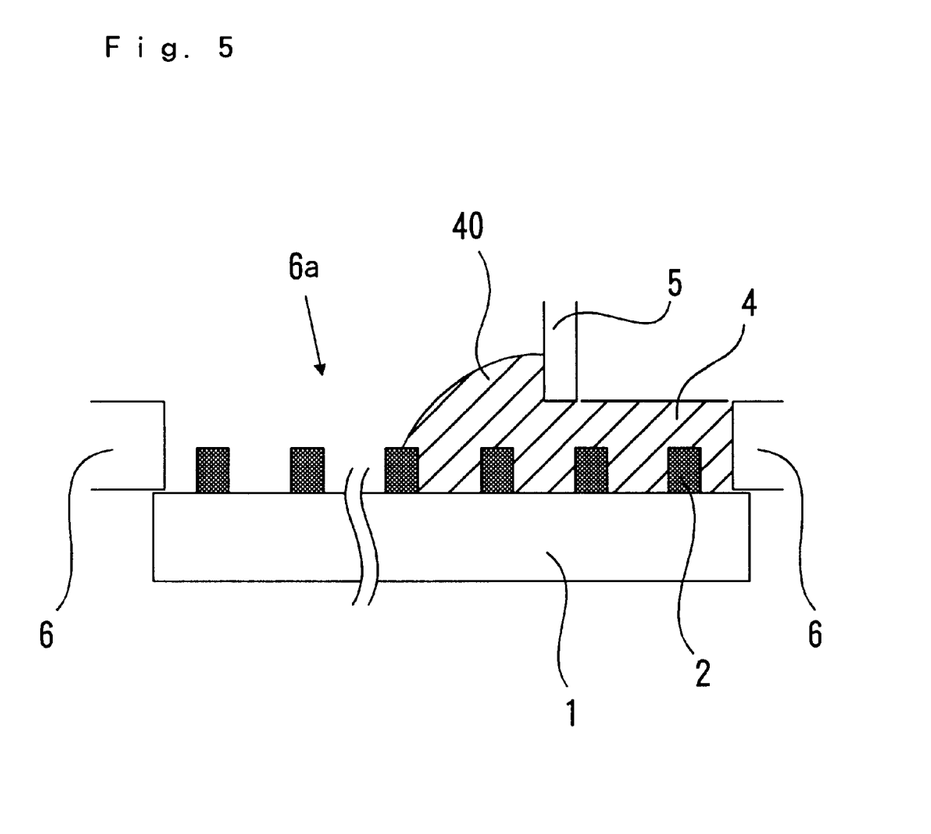
FIG. 5 is a longitudinal sectional view schematically showing a sealant layer as formed by forcedly filling a sealant using screen printing means.

After practicing the step of forming bumps, the wafer 1 is subjected to the step of printing encapsulation. In the printing encapsulation step, a viscous fluid sealant 40 is forcedly filled by screen printing to form on the entire circuit-forming surface of the wafer 1 a sealant layer 4 having a thickness or height higher than the bumps 2 as shown in FIG. 5. Stated more specifically, after a metal mask 6 and the wafer 1 are properly positioned, a specific amount of sealant 40 is fed onto the specified part of the metal mask 6 and forcedly filled into a through-hole 6a of the metal mask 6 by the reciprocative movement of a squeegee 5. After filling, the metal mask 6 is released from the sealant layer 4. The diameter of the through-hole 6a is substantially equal to or smaller by about 1 to about 10 mm than that of the wafer. Preferred sealing materials useful as the sealant 40 are viscous fluids which are excellent in adhesion to the wafer 1, and have low shrinkage in curing, low residual stress after curing, low expansion coefficient, low water absorption and high heat resistance. An epoxy resin composition having such properties is suitable as the sealant 40. Specific examples include a composition containing an epoxy resin and silica in an amount of 60 to 95% by weight based on the composition, such as NPR-780 and NPR-785 (trademarks, products of Japan Rec Co., Ltd.). It may occur that the air is included into the sealant 40 when the sealant 40 is forcedly filled into the through-hole 6a of the metal mask 6. The inclusion of air can be effectively prevented by encapsulation with screen printing means under a vacuum atmosphere preferably in the same vacuum degree between during the forward movement of the squeegee and during the backward movement thereof. Alternatively the vacuum degree may be varied between during the forward movement of the squeegee and during the backward movement thereof (e.g. under 10 Torr or less in the forward movement and under 50 to 150 Torr in the backward movement). In the method of the invention, printing means is used for encapsulation, so that the sealant layer can be thinned to a minimum thickness of about 50 μm. When required, a thick layer up to about 2 mm in thickness can be formed.

Figure 6:
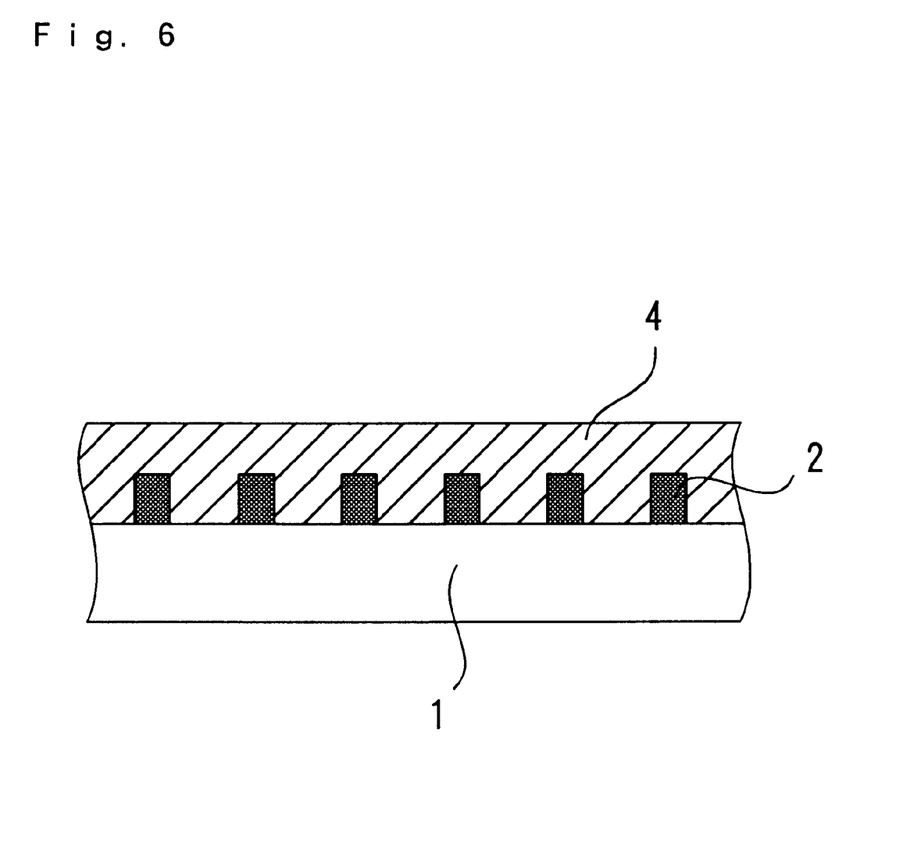
FIG. 6 is a longitudinal sectional view schematically showing the sealant layer as cured on the wafer illustrated in FIG. 4.

After practicing the step of printing encapsulation, the wafer 1 is subjected to the step of curing the sealant layer. In the step of curing the sealant layer, the wafer 1 with the sealant layer is placed into a known heating furnace to cure the sealant layer as shown in FIG. 6.

Figure 7:
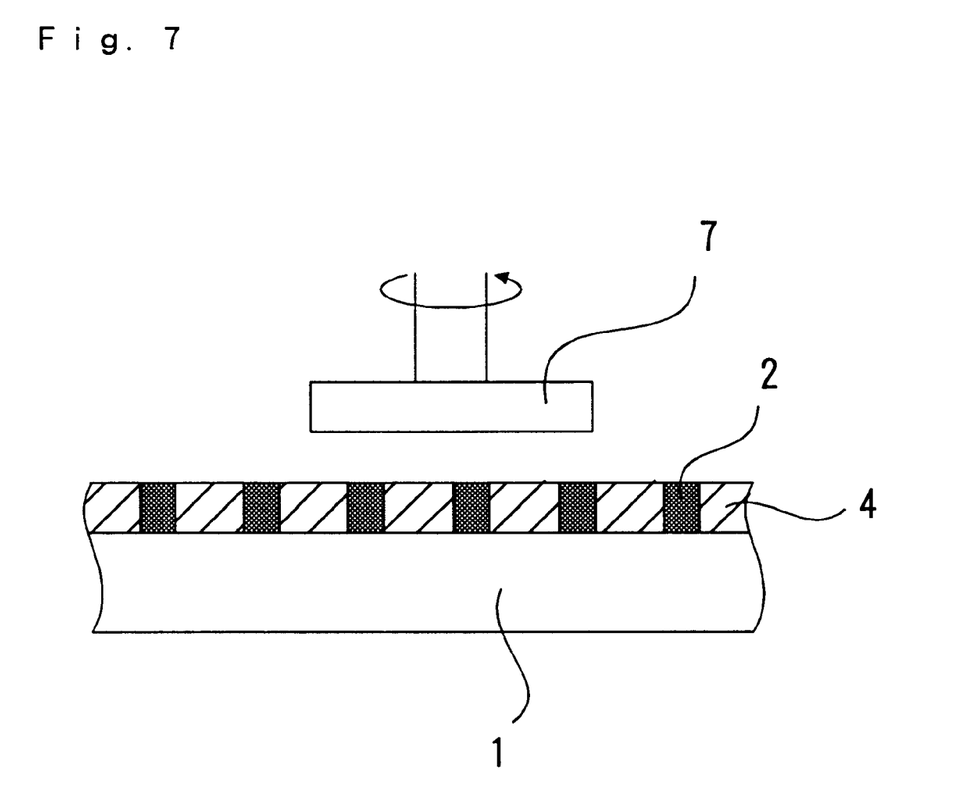
FIG. 7 is a longitudinal sectional view schematically showing the sealant layer illustrated in FIG. 6 whose surface is being ground.

After practicing the step of curing the sealant layer, the wafer 1 is subjected to the step of exposing the bumps. In the step of exposing the bumps, the surface of the sealant layer 4 is ground with a grinder 7 as shown in FIG. 7 until the upper end surface of the bump 2 becomes exposed.

Figure 8:
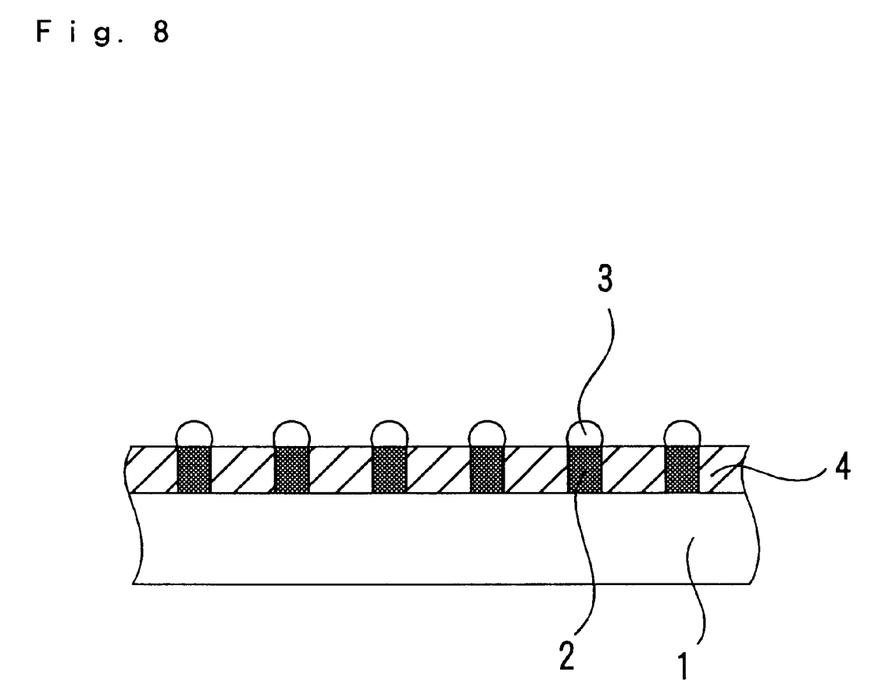
FIG. 8 is a longitudinal sectional view schematically showing solder balls as placed on and as welded to the upper end surface of bumps illustrated in FIG. 7.

After practicing the step of exposing the bumps, the wafer 1 is subjected to the step of welding solder balls. In the step of welding solder balls, solder balls 3 for bonding to the printed circuit board are placed onto the exposed upper end surface of the bumps and welded thereto by the conventional ball mounter as shown in FIG. 8. The solder balls 3 can be welded to the bumps by the conventional bump-forming technique such as a transfer method.

Figure 9:
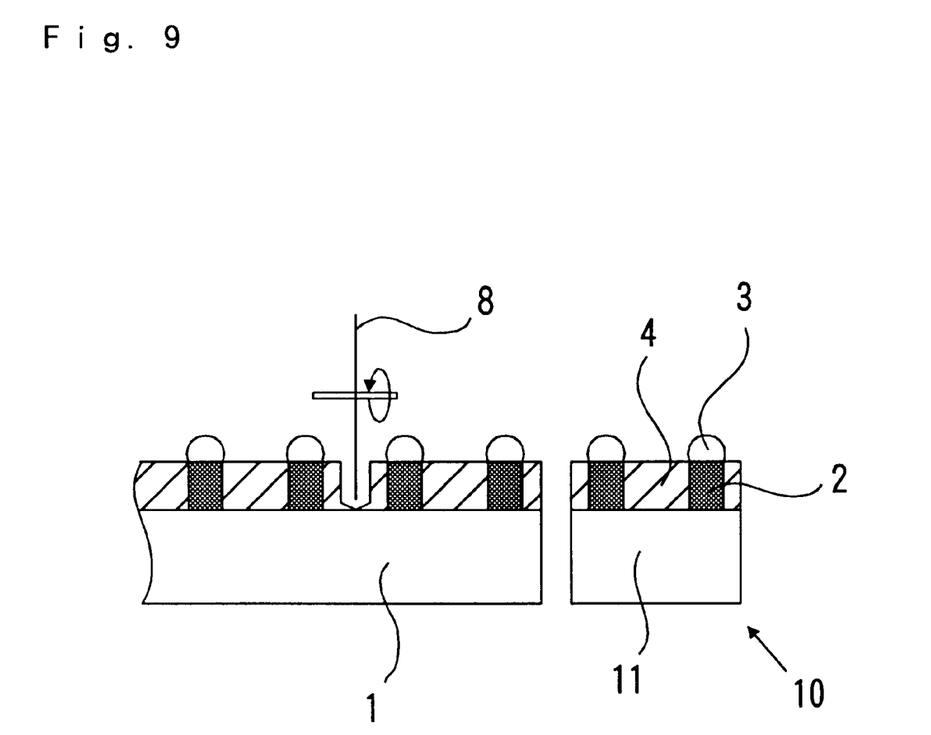
FIG. 9 is a longitudinal sectional view schematically showing the wafer and the sealant layer united as being cut, one by one, into individual semiconductor chips.

Finally after executing the step of welding solder balls, the wafer 1 is subjected to the dicing step. In the dicing step, the wafer 1 and the sealant layer 4 as united are diced by a known dicer 8 into individual chips 11, whereby numerous chip-size semiconductor packages 10 are obtained.

Figure 10:
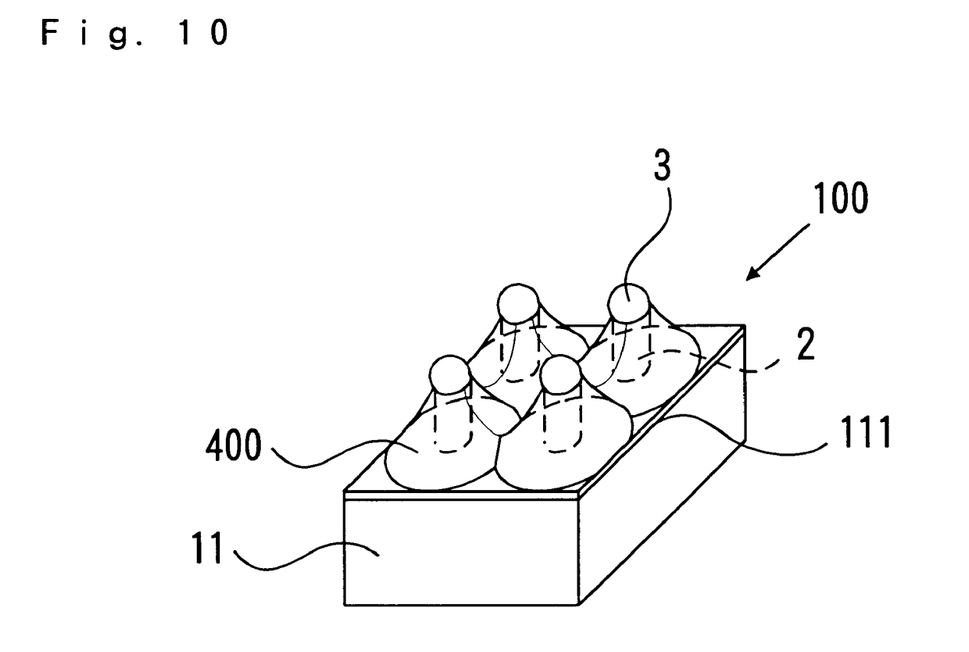
FIG. 10 is a perspective view schematically showing another example of semiconductor packages produced by the producing method of the invention.
Figure 11:
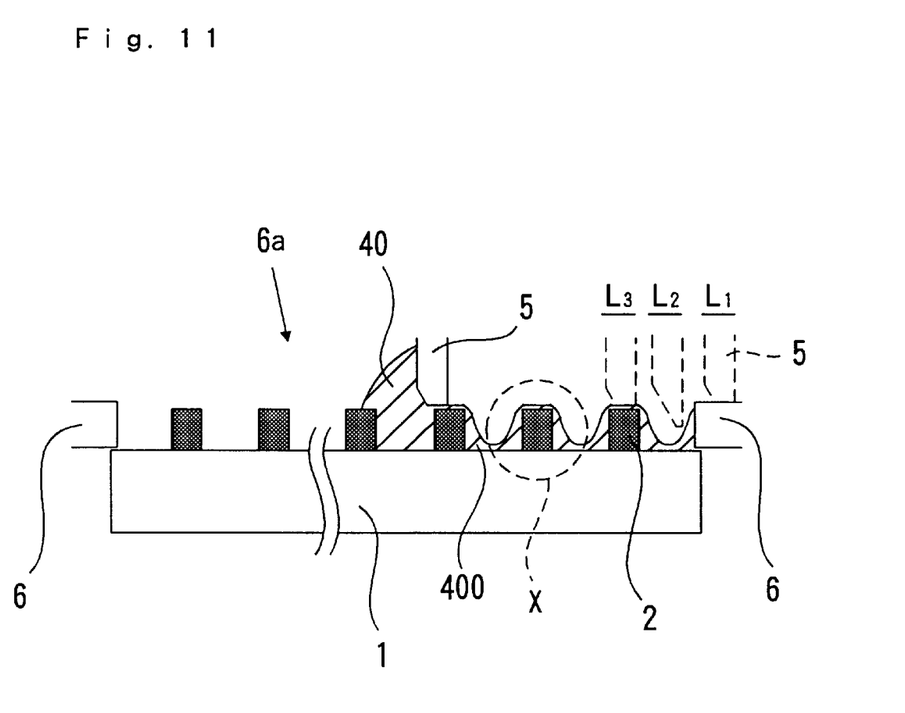
FIG. 11 is a longitudinal sectional view schematically showing a sealant layer as being formed by feeding a sealant onto the wafer with bumps on the circuit-forming surface of the wafer and forcedly spreading the sealant on the wafer by screen printing means in the course of producing the semiconductor package as shown in FIG. 10.
Figure 12:
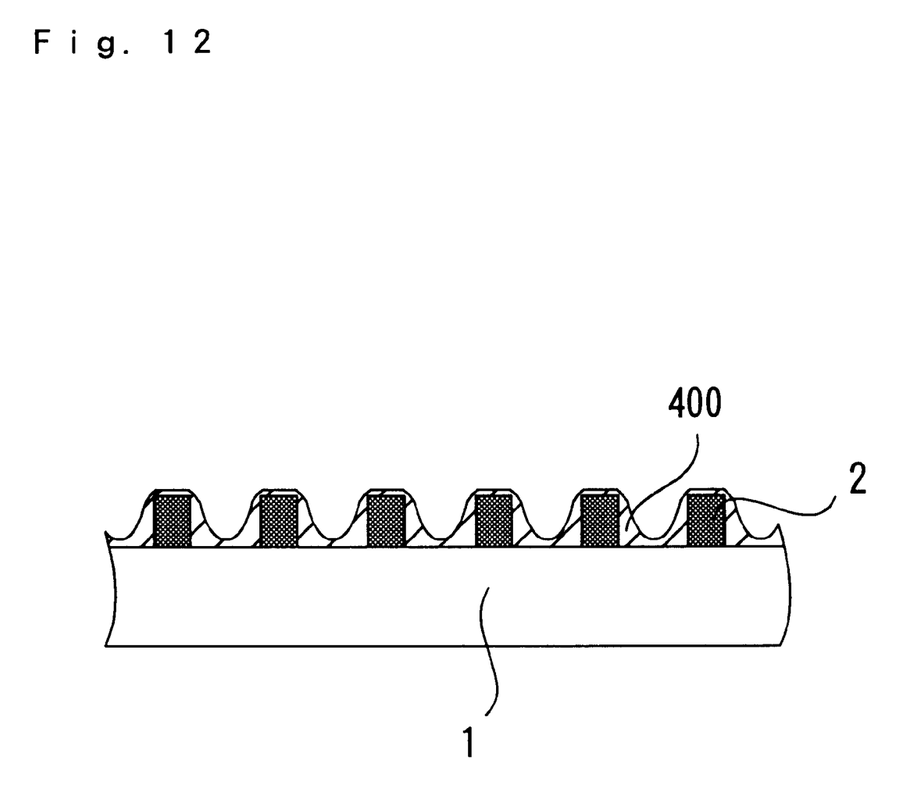
FIG. 12 is a longitudinal sectional view schematically showing the sealant layer as cured on the wafer of FIG. 11.
Figure 13:
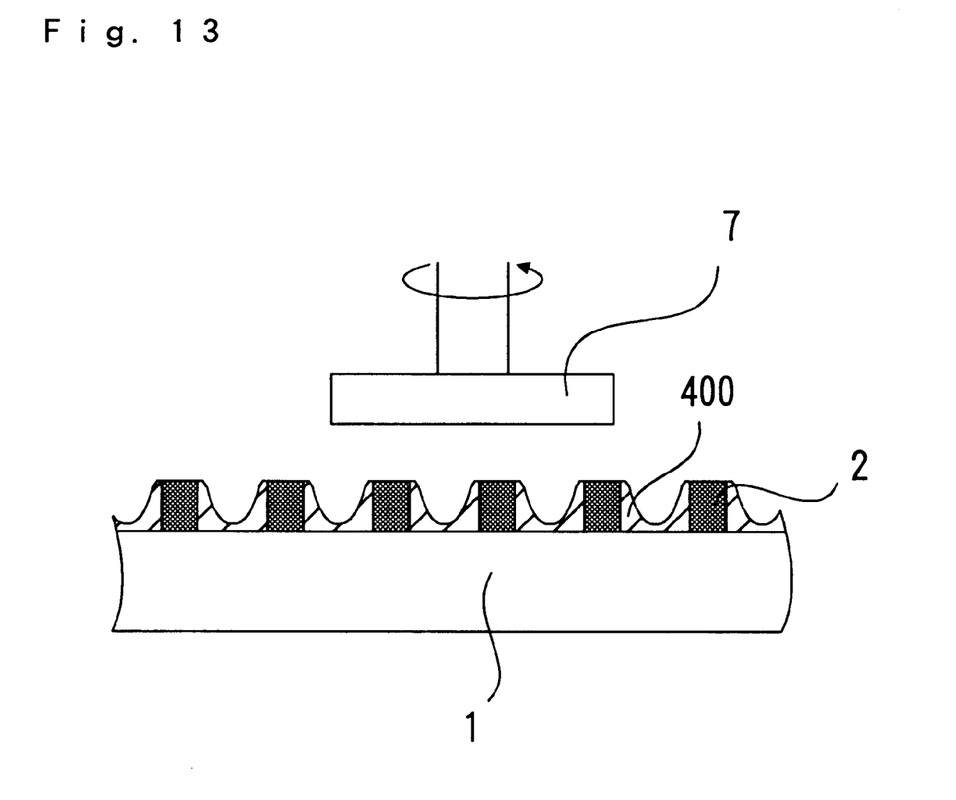
FIG. 13 is a longitudinal sectional view schematically showing the surface of the sealant layer of FIG. 12 as being ground.

A second embodiment of the invention will be described below. FIG. 10 is a perspective view schematically showing another example of semiconductor packages produced by the producing method of the invention. A semiconductor package 100 shown in FIG. 10 is produced by practicing the same steps of FIG. 2 as done in producing the semiconductor package 10 of FIG. 1 except that the steps of printing encapsulation, curing the sealant layer and exposing the bumps are different from the corresponding steps of the first embodiment. FIGS. 11 to 13 are depicted for clarification of the different steps in the second embodiment.

First, the semiconductor package 100 according to the second embodiment is described with reference to FIG. 10. The semiconductor package 100 comprises a semiconductor chip 11, bumps 2, a sealant layer 400 and solder balls 3 which are provided in the semiconductor package 10 of the first embodiment. However, unlike the semiconductor package 10, the upper surface of the sealant layer 400 does not evenly extend and covers the bumps 2 in such a manner that the bump 2 is individually surrounded with a slope as shown in FIG. 10. With this structure, the semiconductor package 100 is such that the bumps 2 are reinforced by the sealant layer 400 and the circuit-forming surface 111 of the chip 11 is covered and protected with the sealant layer 400. Consequently the semiconductor package 100 is equal in mounting reliability to the semiconductor package 10 of the first embodiment shown in FIG. 1.

Figure 11A:
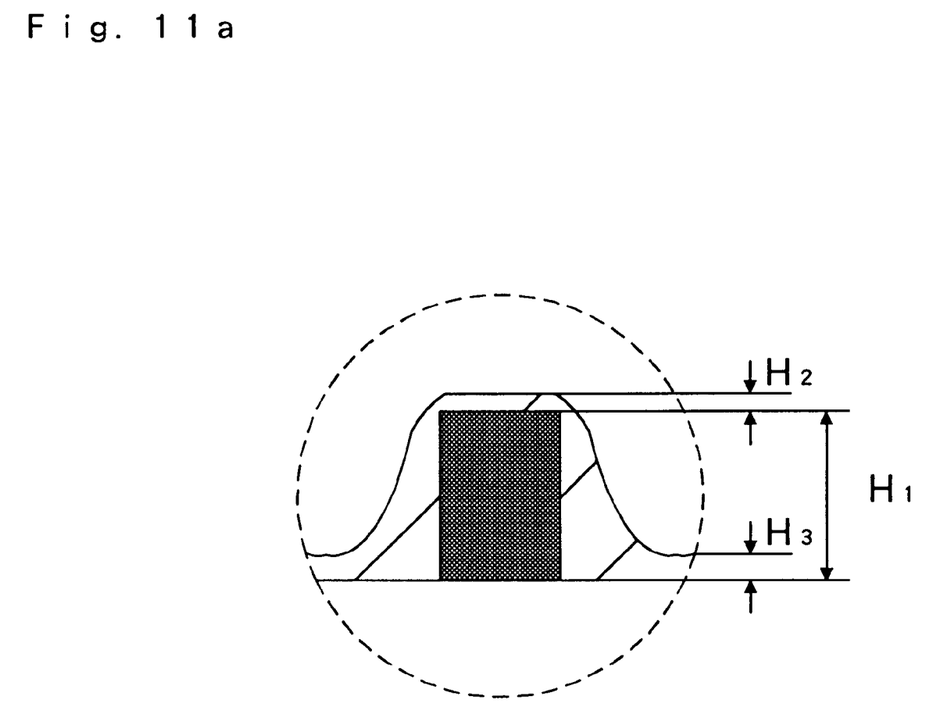
FIG. 11a is an enlarged view schematically showing a portion surrounded with a broken-line circle X in FIG. 11.
Figure 11B:
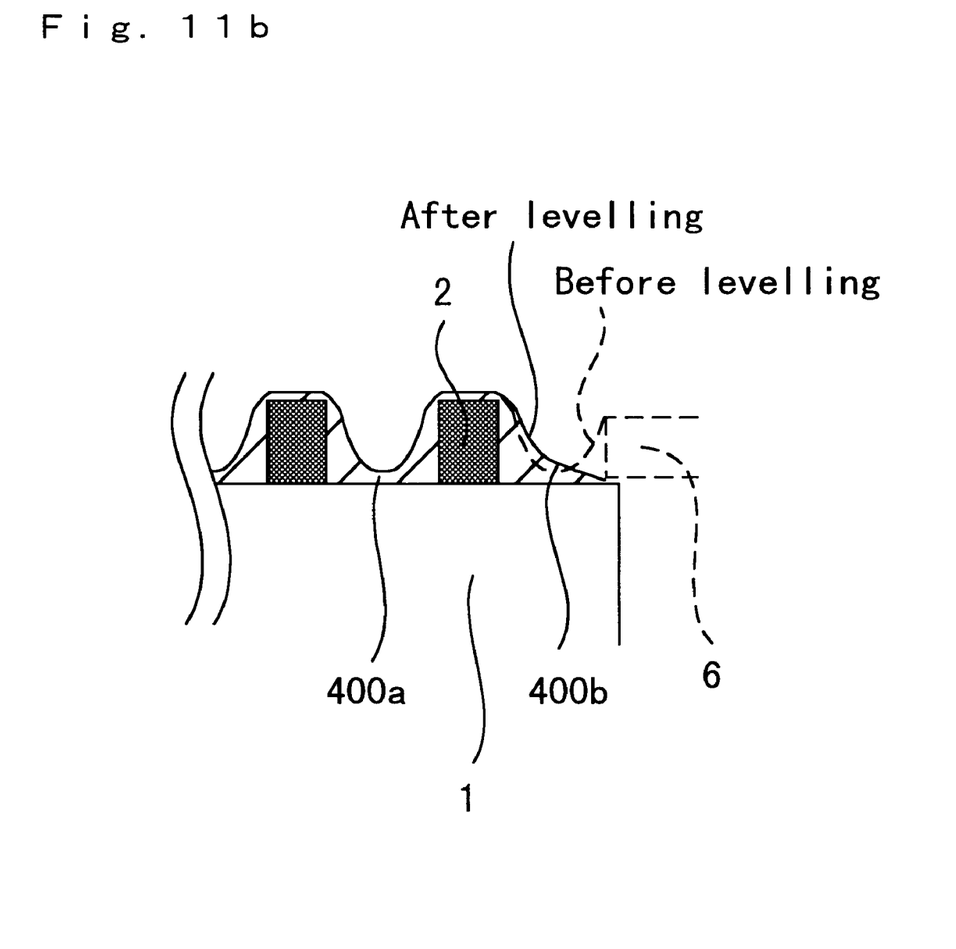
FIG. 11b is a longitudinal sectional view schematically showing the cross section shape of a portion of sealant layer existing at one end of the wafer after release of the metal mask.

The method for producing the semiconductor package 100 is described below. In the method for producing the semiconductor package 100, the steps of forming electronic circuits and forming bumps as shown in FIG. 2 are initially conducted, followed by the step of encapsulating the surface of the wafer. The steps of forming electronic circuits and forming bumps are identical with those executed in producing the semiconductor package 10 according to the first embodiment. Thus, the description of the steps is omitted. As shown in FIG. 11, a squeegee 5 made of an elastic material such as rubber is vertically stretched or retracted to forcedly fill the sealant 40 into the through-hole 6a of the metal mask 6 in the printing encapsulation step of the second embodiment. Then the sealant 40 is raked out to form the sealant layer 400 which is concave and convex with the bumps 2 individually surrounded with a slope. Stated more specifically, the squeegee 5 in the initial position (FIG. 11, $L_1$) is retracted as strongly pressed against the upper surface of the metal mask 6. Then the squeegee 5 proceeds to forcedly fill the sealant 40 into the through-hole 6a and then stretches downward to rake out the sealant 40 so that each bump 2 is surrounded with an inclined portion of the sealant layer 400. In the location void of the bumps 2 (FIG. 11, $L_2$), the extended squeegee 5 partly scrape out the sealant 40 so that the sealant layer 400 is concave and convex as shown in FIG. 10. On the bump 2 in position (FIG. 11, $L_3$), the squeegee 5 is retracted against its top. After forming a thin layer of sealant 40 atop the bumps 2, the squeegee 5 moves forward beyond the bump 2. The end of the squeegee 5 has a shape with, for example, an inclined face as shown in FIG. 11 so that it can readily retract to prevent the bumps 2 from carrying an excessive load. FIG. 11a is an enlarged view schematically showing a portion surrounded with a broken-line circle X in FIG. 11. For example, if the height $H_1$ of the bump 2 is 130 $\mu$m in FIG. 11a, the thickness $H_2$ of the sealant layer 400 on the upper surface of the bumps 2 may be about 20 $\mu$m and the thickness $H_3$ of the sealant layer 400 in the location void of the bumps 2 may be about 50 $\mu$m. To form a portion of sealant layer 400 at one end of the wafer 1 in substantially the same cross section shape as that of sealant layer 400 between the bumps 2, the metal mask 6 and the wafer 1 are adjusted in vertical position so that the upper surface of the metal mask 6 is at a lower level than the top of the bumps 2. FIG. 11b is a longitudinal sectional view schematically showing the cross section shape of a portion of sealant layer 400 at one end of the wafer 1 after release of the metal mask 6. When the upper surface of the metal mask 6 is brought to a lower level than the top of the bumps 2, a sealant layer portion 400a at one end of the metal mask 6 levels off to become substantially identical in thickness with a sealant layer portion 400b between the bumps 2. In this way, it becomes possible to cut the wafer 1 with the resin layer into semiconductor packages 100 individually having substantially the same cross section shape. When the sealant layer 400 is formed according to the second embodiment, the sealant 40 will be consumed in a reduced amount, whereby lower costs are involved in producing semiconductor packages, as compared with the costs for producing semiconductor packages according to the first embodiment. The second embodiment can employ favorable techniques used in the first embodiment such as materials of the sealant 40, and printing encapsulation under a vacuum atmosphere.

After practicing the step of printing encapsulation, the wafer 1 is subject(ed to the step of curing the sealant layer. In the step of curing the sealant layer, the printed wafer 1 is placed into a heating furnace to cure the sealant layer indented between the pairs of bumps as shown in FIG. 12.

After practicing the step of curing the sealant layer, the wafer 1 is subjected to the step of exposing the bumps. In the step of exposing the bumps, the surface of the sealant layer 400 is ground with the grinder 7 as shown in FIG. 13 until the upper end surface of the bump 2 becomes exposed. After the layer 400 on the bumps 2 is ground to expose the bumps 2, preferably the top of bumps 2 is slightly ground to become horizontal, thereby facilitating welding of solder balls to the top of bumps 2. Unlike the first embodiment, the portion to be ground is limited in the second embodiment to the layer on the upper surface of bumps 2 and possibly to the surface of the bumps 2, whereby grinding is facilitated. Further, a lower resistance to grinding is entailed, whereby the load on the bumps 2 is decreased and the possibility of damaging the bumps 2 is lowered.

After practicing the step of exposing the bumps, a plurality of semiconductor packages 100 are obtained following the step of welding solder balls and the dicing steps. The step of welding solder balls and the dicing steps can be carried out in the same manner as in the first embodiment. Thus the description of these steps is omitted.

According to the producing method of the invention, screen printing means is used to encapsulate the entire surface of the wafer with a resin, so that the equipment costs can be markedly reduced as compared with conventional methods using a mold. Since the formation of sealant layer and the heat-curing are separately done, the production operation can be continuously performed without necessity of confining the wafer to a step for a prolonged period of time. Moreover, the sealant layer can be thinned to a minimum thickness of about 50 $\mu$m.

What we claim is:

1. A method for producing semiconductor packages, comprising the steps of:

forming electronic circuits for a plurality of semiconductor chips on a wafer;

forming bumps on circuit-provided surface of the wafer in accordance with the electronic circuits, each bump having an upper end;

screen-printing the bump-provided surface of the wafer with a resin sealant to encapsulate the bumps, including their upper ends, and the remaining circuit-provided surface of the wafer with the resin sealant, thereby forming a sealant layer;

curing the sealant layer;

grinding the cured sealant layer downward until the upper ends of the bumps become exposed;

placing solder balls on the exposed upper ends of the bumps to weld the balls thereto; and dicing the wafer and the sealant layer as an integrated unit into individual semiconductor chips.

2. The method according to claim 1, wherein the screen-printing step comprises the steps of:

placing a mask having through-holes on the bump-provided surface of the wafer;

feeding the resin sealant onto the mask; and squeegeeing the sealant onto the bump-provided surface through the through-holes by sliding a squeegee along the mask.

3. The method according to claim 2, wherein the squeegee is made of elastic material and is passed over the bumps to make the sealant cave in between the bumps while being slid along the mask.

4. The method according to claim 1, wherein the resin sealant is a viscous fluid.

\* \* \* \* \*